United States Patent [19]
Goddard-Watts

[11] Patent Number: 4,563,812
[45] Date of Patent: Jan. 14, 1986

[54] FILAMENT LAYING APPARATUS AND A METHOD OF FABRICATING A HARNESS

[75] Inventor: Mark Goddard-Watts, Basingstoke, England

[73] Assignee: British Aerospace Public Limited Co., London, England

[21] Appl. No.: 580,140

[22] Filed: Feb. 14, 1984

[30] Foreign Application Priority Data

Feb. 15, 1983 [GB] United Kingdom ................. 8304103

[51] Int. Cl.⁴ ....................... H01R 43/00; B23P 19/00
[52] U.S. Cl. ....................................... 29/857; 29/747; 140/93 R
[58] Field of Search .............. 29/857, 56.6, 747, 33 F, 29/564.8, 564.4; 140/93 R, 92.1

[56] References Cited

U.S. PATENT DOCUMENTS

| 4,145,807 | 3/1979 | Beetz et al. | 29/857 |
| 4,238,981 | 12/1980 | Karl | 81/9.51 X |
| 4,341,014 | 7/1982 | Loy et al. | 29/857 |
| 4,348,805 | 9/1982 | Gibbons . | |
| 4,399,842 | 8/1983 | Gibbons . | |
| 4,442,872 | 4/1984 | Gibbons . | |

FOREIGN PATENT DOCUMENTS 2024052A 1/1980 United Kingdom .
2025272A 1/1980 United Kingdom .
2095134A 9/1982 United Kingdom .
2095135A 9/1982 United Kingdom .

OTHER PUBLICATIONS

"Here a Robot, There a Robot, Everywhere a Robot . . . " by Lewis Holmes, Robotics—IEEE News, Mar. 1982.

Primary Examiner—Howard N. Goldberg
Assistant Examiner—Carl J. Arbes
Attorney, Agent, or Firm—Cushman, Darby & Cushman

[57] ABSTRACT

Apparatus for laying a filament includes a tool 10 moveable to follow a predetermined path, the tool comprising a storage chamber 12, 12', opposed outlets 30, 28, 16 and 116, 128 and clamp arrangements 19, 119 associated therewith. In use, filament is fed via outlet 30, 28, 16 through the chamber 12, 12' to protrude from outlet 116, 128. Clamp 119 is actuated and continued feeding causes the filament to be stored. Feeding is continued until the other end of the filament protrudes from outlet 116, 128. The tool is operable to define a gap through which filament may be bodily laterally withdrawn, once its free ends have been attached to respective attachment points.

13 Claims, 5 Drawing Figures

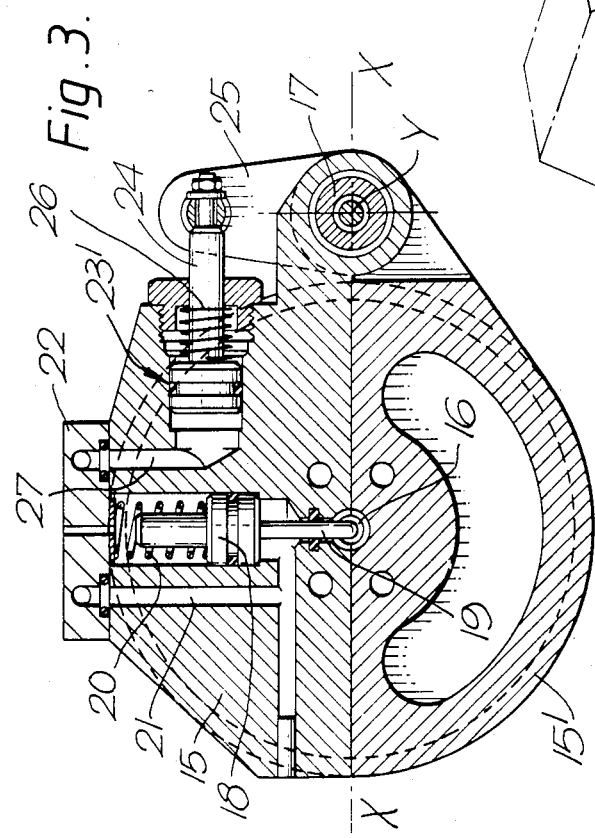
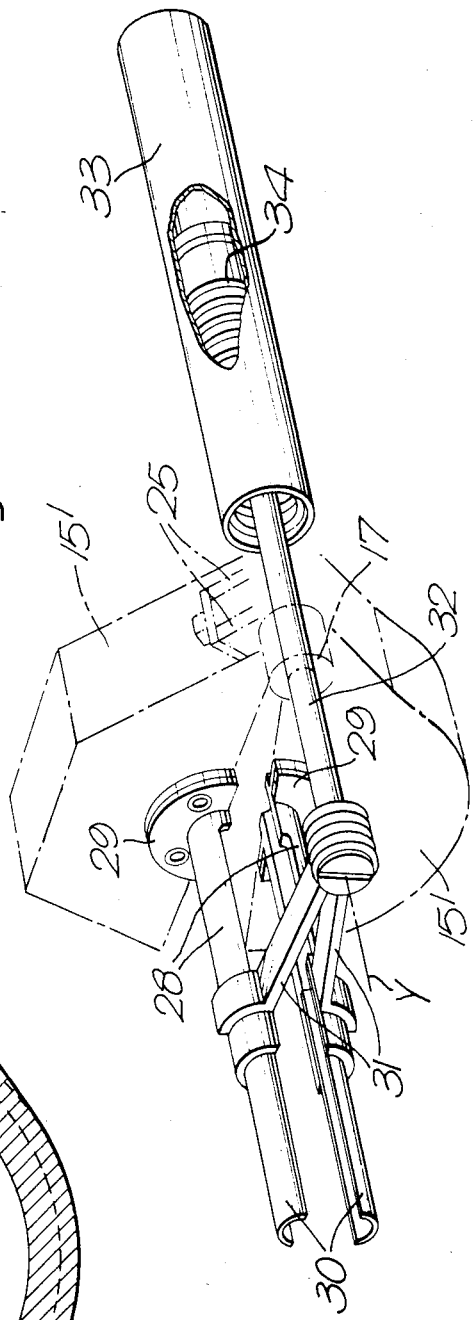

Fig.5(III). 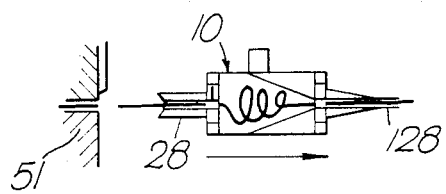

Fig.5(VII). 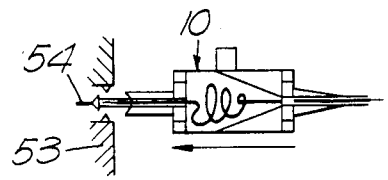

Fig.5(VIII).
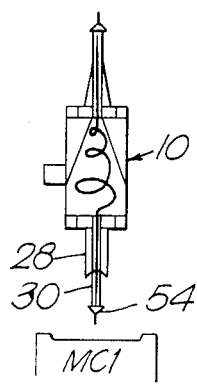
Fig.5(IX).
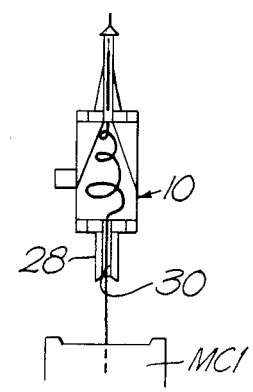
Fig.5(X).
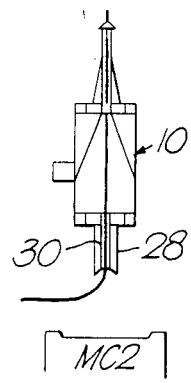
Fig.5(XI).
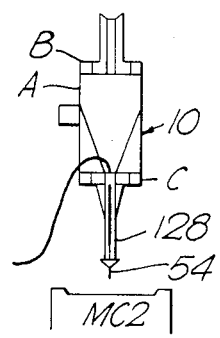
Fig.5(XII).
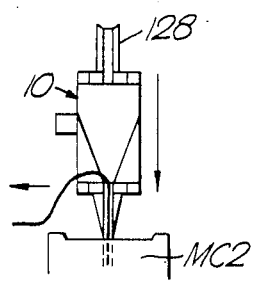
Fig.5(XIII).
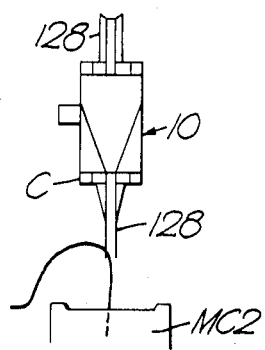

FILAMENT LAYING APPARATUS AND A METHOD OF FABRICATING A HARNESS

This invention relates to apparatus for and a method of laying a filament, and in particular but not exclusively to fabricating a filament harness.

Such harnesses are used where it is wished to provide a complex network of signal carrying filaments interconnecting a number of functional elements, and they find extensive use in the automotive, aircraft and computer industries.

In the past it has been customary to lay up such harnesses by hand on a loom board on which the required network is displayed. This however is time consuming and moreover when the harness has been laid up it is still necessary to attach the various multipin connectors to the ends of the harness by hand.

According to one aspect of this invention, there is provided apparatus for laying a length of filament along a path and for attaching a free end thereof to an attachment point, said apparatus including a tool moveable generally to follow said path, said tool comprising storage chamber means adapted to receive and store a length of filament, two ports provided each adjacent a respective opposed end region of said storage chamber means and communicating with said storage chamber and through which filament may pass into and out of the chamber, elongate tubular outlet means attached around one of said ports and communicating therewith and extending externally of said chamber, said outlet means being adapted to assist attachment of said free end to said attachment point, and stop means associated with at least one of said ports operable to prevent movement of a filament therethrough, the arrangement being such that filament passed into said chamber means via one of said ports is caused to pass through said chamber and to leave it via the other port having stop means associated therewith, the stop means being operable to prevent further movement of the filament through said other port and thus to cause additional filament entering the chamber via said one port to be stowed in said chamber.

This arrangement allows a substantial length of filament to be housed compactly within the tool in readiness for being drawn out when the respective free end of the filament has been attached to its attachment point and when the tool is moved away therefrom along its path. By housing the length of filament generally within the storage means, the tendency for any tangling or snagging of the filament is reduced.

Preferably said tool includes two elongate tubular outlet means each attached around a respective port and communicating therewith and each being adapted to assist attachment of a free end of filament protruding therefrom to a respective attachment point, said tool being provided with a radially extending gap providing means operable to provide a gap extending along the full length of the tool and outlet means whereby said filament can be withdrawn bodily laterally when both its free ends are attached to their respective attachment points.

Conveniently, said tool comprises two portions hingable between a closed position and an open position in which they define a lateral slot through which filament may be withdrawn.

In order to ensure that a filament passed into the chamber via one port is caused to leave the chamber via the other port it is preferred for an end region of said storage chamber means to be generally funnel shaped, and for the respective port means to be located at the apex region thereof, and it is further preferred for the ports to be in axial alignment.

Where the tool includes two elongate tubular outlet means, it is preferred for each to have associated therewith stop means operable to prevent passage of filament therethrough. In addition, to assist feeding of the filament into and out of the storage chamber means it is preferred for the outlet means through which filament is fed to be longitudinally extensible.

According to a further aspect of this invention, there is provided a method of fabricating a filament harness comprising the steps of (i) selecting a tool having storage chamber means for storing filament and first and second ports through which filament may pass into and out of said chamber means, (ii) initially feeding a portion of a predetermined length of filament into said chamber means via one of said ports and causing a free end thereof to protrude from the other of said ports, (iii) preventing further movement of said filament through said other port whilst continuing to feed said filament into said chamber means until the other free end thereof protrudes from said one end by a relatively small amount, (iv) moving said tool to a position adjacent a first station, (v) attaching the respective free end protruding from one of said outlets to a predetermined attachmemt point, (vi) moving said tool along a predetermined path to a position adjacent a second station, and (vii) releasing the respective free end of the filament adjacent a further attachment point.

In a preferred method, said selected tool is provided with radially extending gap providing means operable to provide a gap extending along the whole length of the tool and outlet means whereby said filament can be withdrawn from the tool bodily laterally, and the method preferably further comprises the steps of attaching the other free end of the filament to a further attachment point, and operating said radially extending gap providing means to allow said filament to be withdrawn from the tool when its free ends are each attached to their respective attachment points.

By way of example only, one specific embodiment of filament laying apparatus constructed in accordance with this invention and a method of fabricating a filament harness using the apparatus will now be described in detail, reference being made to the accompanying drawings in which:

FIG. 3 is a section view of the apparatus as viewed on line III—III of FIG. 1;

FIG. 4 is a perspective detail view of the extendable insertion tube and associated extension/retraction mechanism located at the left hand end of the tool of FIG. 1.

Figure 2:
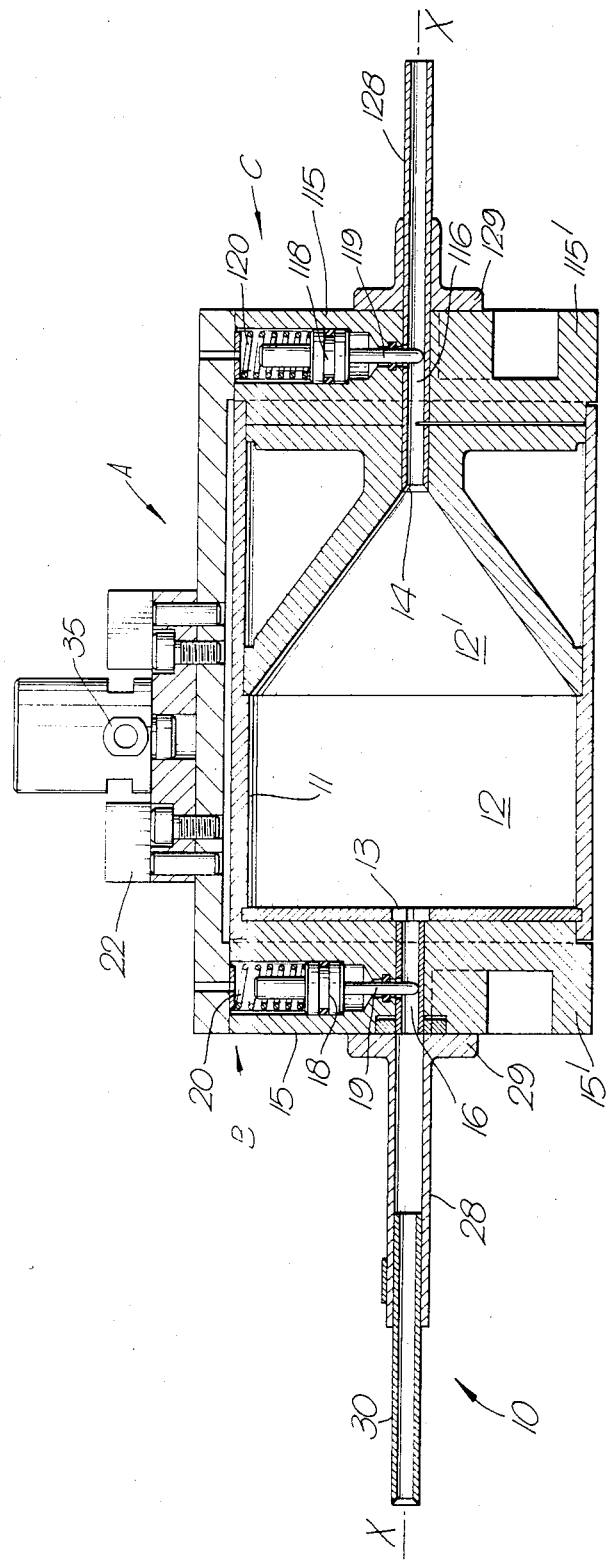
FIG. 2 is a side sectional view of the apparatus of FIG. 1.

In this description, "upper", "lower", "left-hand", "right-hand" and similar expressions refer to the apparatus as viewed in FIG. 2.

The apparatus illustrated in FIGS. 1 to 4 is intended to be attached to the work head of a pre-programmable robot arm. In a manner known in the art the robot arm may be moved along a predetermined path under the control of its program. The robot arm also has a facility for positioning its workhead adjacent to a tool store, and exchanging a tool held in the work head for a particular tool held in the store. The work head has various pneumatic supply lines which control operation of the tool currently held in the work head, and the various pneumatic supplies are also preprogrammably controlled.

Referring now to FIGS. 1 to 4 there is shown a filament laying tool 10 which comprises three functional elements; a filament storage chamber A, a left hand clamp hinge unit B and a right hand clamp hinge unit C, each of which comprises an upper portion and a lower portion generally symmetrically disposed about a horizontal transverse plane X—X (see FIGS. 2 and 3). The filament storage chamber comprises walls 11 defining an internal cavity having a cylindrical portion 12 and a funnel shaped portion 12'. In the opposed end walls of the cavity there is provided a pair of axially aligned ports 13, 14 through which a filament may be passed into or out of the storage cavity. The two portions of the filament storage cavity are hingably movable about axis Y (FIGS. 1 and 3) for movement between a closed position (as viewed in FIGS. 1 to 4) and an open position in which a lateral slot or gap is defined through which filament may be withdrawn.

Referring in particular to FIG. 3, the left hand clamp hinge unit comprises upper and lower housing members 15,15' which meet at plane X—X when in their closed position. A central filament bore 16 is defined between the members 15,15' which communicates with port 13, and its axis is coplanar with plane X—X. The upper and lower housing members are pivoted together by means of bush 17 for hinging movement about axis Y. The upper and lower housing members 15,15' are fixedly attached to the respective upper and lower portions of storage chamber A so that each hinges in unison.

A pneumatically-operated clamping arrangement comprising a piston/cylinder device 18 operating a dog 19 which is movable into bore 16 to clamp a filament is provided in the upper housing member 15. The piston is biassed towards a clamping position by means of coil spring 20, and operating fluid is supplied to the piston-cylinder device 18 by means of ducts 21 communicating with the bayonet fitting 22 of the tool.

A pneumatically-operated hinge-actuator comprising a piston/cylinder device 23 and an actuator rod 24 associated therewith is also located in the upper housing member 15. The free end of the actuator rod 24 is attached to a bifurcated arm 25 extending from the lower housing member. The piston of the piston cylinder device is biassed to the left by spring 26, thus biassing the upper and lower housing members 15,15' and the respective attached portions of the storage chamber means towards their open position. Operating fluid is supplied to the piston-cylinder device 23 via ducts 27 communicating with the bayonet fitting 22 of the tool.

Referring now to FIG. 4, an outer split tube 28 is secured to upper and lower housing members 15, 15' respectively by means of a split collar 29, one half secured to member 15, the other half secured to member 15'. The distal end of the split tube 28 is chamfered and each half of the outer split tube 28 carries a respective half of an inner insertion tube 30 for longitudinal extension and retraction. Each half of the split insertion tube 30 is coupled to a radius arm 31, each of the radius arms being pivotally coupled to the actuator rod 32 of a pneumatic ram 33, the actuator rod lying coincident with axis Y and thus the hinge axis of the upper and lower housing members 15, 15'.

The actuator rod 32 is biassed by coil spring 34 to a retracted position in which the split insertion tube 30 is retracted wholly within the outer split tube 28. Operating fluid is supplied to the pneumatic ram 33 by means of tubing (not shown) connected to an outlet connector 35 provided on the bayonet fitting 22 of the tool. Admission of fluid to the pneumatic ram 33 causes the split insertion tube 30 to be extended to adopt the position shown in FIGS. 1 to 4.

Referring now to the right hand clamp hinge unit C this is of similar form to the left hand clamp unit B and will therefore not be described in detail again. Similar items will be given similar references, but prefixed by 1.

There are two primary differences between clamp unit B and clamp unit C; firstly only the upper housing member 115 is attached to the associated portion of chamber A, the lower housing member 115' being free to pivot independently of the adjacent portion of chamber A. Secondly, clamp unit C does not include an extensible outer split insertion tube 30 or its associated actuating equipment. Furthermore the internal and external diameters of the inner split insertion tube 30 of the left hand clamp unit match those of the outer split tube 128 of the right hand clamp unit.

As mentioned previously, the tool includes a bayonet fitting 22 by which it is removably mountable on a complementary fitting on the workhead of the robot arm. The bayonet fitting 22 has associated therewith various fluid ports 35, 36, 37, 38, 39 which cooperate with associated ports associated with the fitting provided on the workhead of the robot, to supply fluid to the piston cylinders 18, 118, 23, 123 and the pneumatic ram 33 under the control of the operating program.

Figure 1:
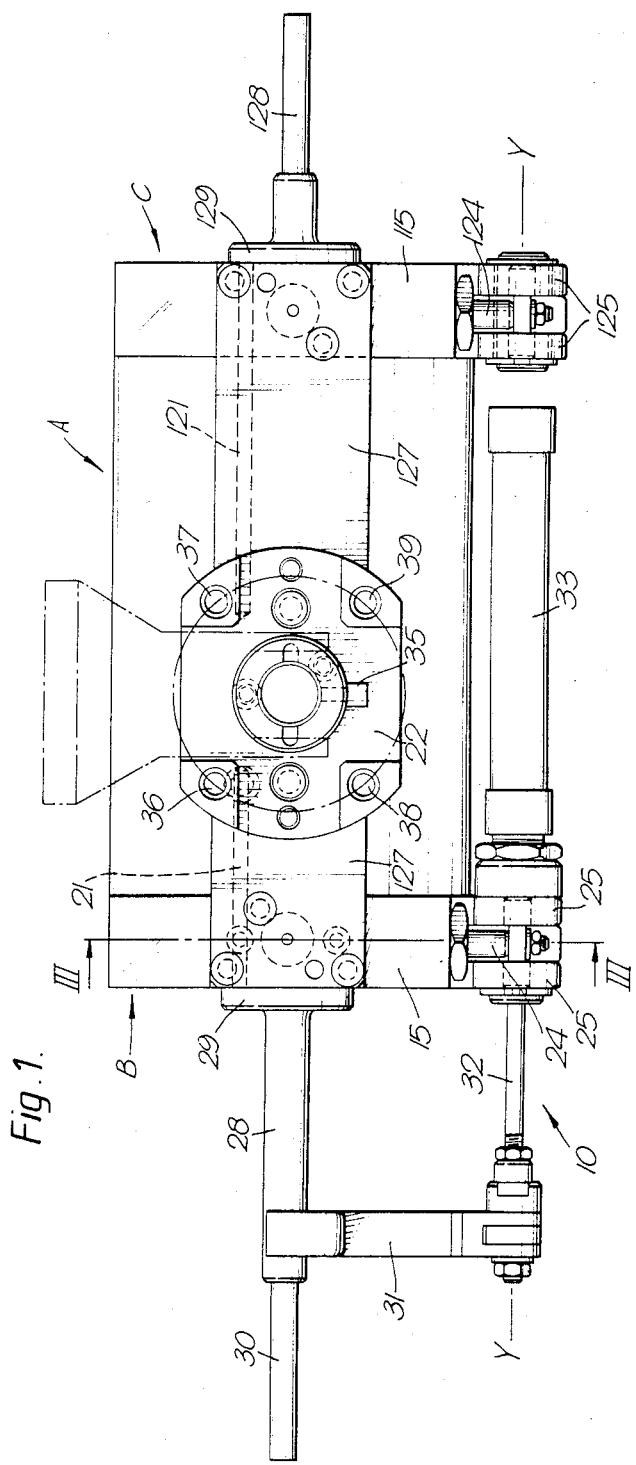
FIG. 1 is a top plan view of filament laying apparatus.

A method of fabricating a filament harness employing the embodiment of tool of FIG. 1 will now be described with reference to FIG. 5.

Initially the robot arm 50 is programmed to place a series of guide pins in a loom table along the various paths of the network of the harness using a pin inserting head selected from a magazine of tool heads. At each of the ends of the harness where it is wished to provide a multipin connector of the type comprising an insulating base portion with a plurality of sockets in each of which is provided a male or female connector terminal, there is provided a respective base portion MC1, MC2, the appropriate multiconnector.

Figure 5I:
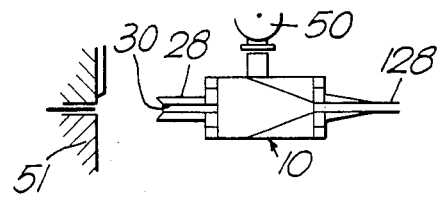
FIG. 5 shows schematically a sequence of operations for the apparatus of FIGS. 1 to 4 when fabricating a filament harness.

The robot arm 50 then returns to a position adjacent a tool store where the pin-laying head is replaced by a tool 10 of the form described above. The tool is initially in a closed configuration with left and right hand clamp hinge units B and C both closed and with clamp dogs 19, 119 unclamped but with the inner insertion tube 30 withdrawn into outer split tube 28 (FIG. 5(i)). The robot arm 50 then positions the tool 10 with inner insertion tube 30 facing a wire dispenser 51 in filament receiving relationship therewith. The wire dispenser 51 then feeds a sufficient amount of cable into the storage chamber A of the tool 10 via inner insertion tube 30 so that a small portion protrudes from further outer split tube 128 (FIG. 5(*ii*)) and then the associated clamp dog 119 is actuated to clamp that end region of the wire.

The remainder of the wire is then dispensed, coiling in chamber 11 by virtue of its internal funnel-shape, and the other clamp dog 19 is actuated to clamp the other end region of the wire.

Figure 5:
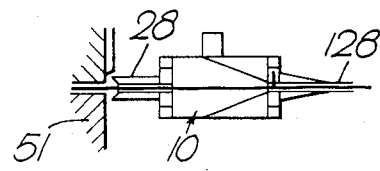
Figure 5:
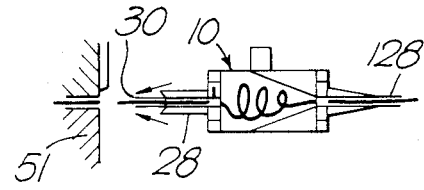
Figure 5V:
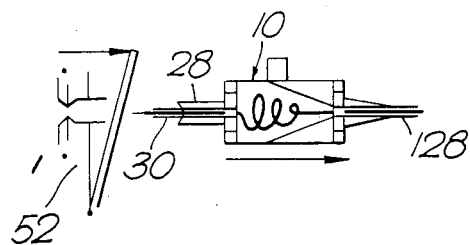
Figure 5:
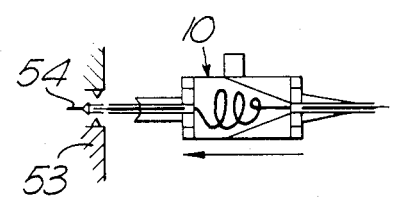

The robot arm 50 then moves the tool a short distance from the wire dispenser and the wire is guillotined leaving a portion protruding from outer split tube 28 (FIG. 5(*iii*)). Inner split insertion tube 30 is then extended by means of pneumatic ram 33, still leaving a free end of the wire protruding therefrom (FIG. 5(*iv*)).

The robot arm 50 then moves the tool 10 to a wire-stripping machine 52 offering each protruding free end of the wire to the machine in turn to strip the insulating cover therefrom (FIG. 5(*v*)).

The robot arm 50 then moves the tool 10 to a contact-crimping machine 53 which attaches a terminal 54 to each stripped end of the wire. The robot arm inserts a free end of the wire into an uncrimped terminal 54 held by the crimping machine, the machine then crimps the terminal on the wire (FIG. 5(*vi*)). The respective clamp dog stem 19, 119 is then released and the tool is moved by the robot arm further towards the crimping machine so that a portion of the terminal is received and located in the bore of the respective split tube 30, 128 and clamp dog 19, 119 reapplied (FIG. 5(*vii*)).

The robot arm 50 then moves the tool 10 accurately to position it over the base portion of a multipin connector MC1 with that terminal 54 housed in split insertion tube 30 located directly above a predetermined socket of a first multipin connector (FIG. 5(*viii*)). The robot arm then moves the tool downwardly to urge terminal 54 into its socket until it is fixedly engaged thereby. Clamp dog 19 is then released, the tool moved upwardly and split insertion tube 30 retracted into outer split tube 28 by pneumatic ram 33 (FIG. 5(*ix*)).

The robot arm 50 then moves the tool along a predetermined path and wire is drawn out of the chamber 11, until the tool is positioned above the base portion of a second multipin connector MC2 (FIG. 5(*x*)). The tool 10 is inverted and piston cylinder device 18 is then actuated to open hinge clamp unit B together with the chamber A to define a slot to allow filament to be removed laterally therefrom (FIG. 5(*xi*)). The robot arm 50 then moves the tool downwardly so that terminal 54 housed in further split insertion tube 128 is urged into the predetermined socket of the base portion of the multipin connector MC2 and engaged thereby (FIG. 5(*xii*)). Clamp dog 119 is then released, the tool moved upwardly, and piston cylinder device 118 actuated to open clamp unit C to allow the wire to be laterally withdrawn therefrom FIG. 5(*xiii*)). Piston cylinders 18, 118 are then re-actuated to cause the the clamp units B and C and chamber A to close, and the process is then repeated for the next constituent wire.

The process is repeated until all of the constituent wires of the harness have been laid and attached to their respective multi-connectors. Once this has been achieved, the wire laying tool 10 is returned to the tool store and replaced by a tying tool which bundles the harness at appropriate points. The finished harness is then ready for removal.

Referring to the form of the internal cavity of the tool 10, the funnel shape causes a filament fed into the cavity via port 13 automatically to be caused to exit the cavity via port 14.

What I claim is:

1. In filament laying apparatus including arm means movable in accordance with a predetermined programme of commands to move along a selected path, a filament laying tool including attachment means for attachment to said arm means, a main body portion having a generally closed internal storage chamber and an inlet and an outlet disposed in opposed end regions of said storage chamber for filament to pass into and out of said chamber, hollow elongate probe means attached to said main body portion adjacent said outlet and in communication therewith, stop means operatively associated with said probe means and actuable to prevent the passage of filament therethrough, the storage chamber being shaped such that filament having entered said storage chamber via said inlet is caused to pass through said probe means via said outlet and that on actuation of said stop means, further filament entering into said chamber is caused to accumulate therein in compact condition.

2. A filament laying tool according to claim 1, which includes further elongate hollow probe means attached to said main body portion adjacent said inlet and in communication therewith, said tool being provided with radially extending gap providing means operable to provide a gap extending along the length of the tool whereby said filament may be withdrawn laterally via said gap.

3. A filament laying tool according to claim 2, wherein each of the said main body portion and said elongate hollow probe means comprise segment elements hingeably openable about a common hinge axis thereby to define said gap.

4. A filament laying tool according to claim 3, wherein one of the segment elements of said elongate hollow probe means is capable of independent hinging movement with respect to the adjacent segment element of said storage chamber.

5. A filament laying tool according to claim 2, wherein said further elongate probe means includes a main portion attached to said main body portion and an extension portion retractable into said main portion.

6. A filament laying tool according to claim 2, which includes further stop means associated with said further elongate hollow probe means and operable to prevent the passage of filament therethrough.

7. A filament laying tool according to claim 1, wherein said storage chamber includes a generally cylindrical portion adjacent said inlet and is of generally conical shape adjacent said outlet, the outlet being located at the apex region of said conical shape.

8. In filament laying apparatus including arm means movable in accordance with a predetermined programme of commands to move along a selected path, a filament laying tool including attachment means for attachment to said arm means, a main body portion having a generally closed internal storage chamber and an inlet and an outlet disposed in opposed end regions of said storage chamber for filament to pass into and out of said chamber, hollow elongate probe means attached to said main body portion adjacent said outlet and in communication therewith, stop means associated with said probe means and operable to prevent the passage of filament therethrough, further hollow elongate probe means attached to said main body portion adjacent said inlet and in communication therewith, each of said main body portion and said elongate hollow probe means comprising segment elements hingeably openable about a common hinge axis thereby to define a gap extruding along the length of the tool whereby said filament may be withdrawn laterally via said gap.

9. A method of fabricating a filament harness comprising the steps of:
   (i) selecting a filament laying tool having a main body portion having a generally closed internal storage chamber and an inlet and an outlet disposed in opposed end regions of said chamber for filament to pass into and out of said chamber, hollow elongate probe means attached to said main body portion adjacent said outlet and in communication therewith, and stop means associated with said elongate probe means and operable to prevent the passage of filament therethrough,
   (ii) initially feeding a free end portion of a predetermined length of filament via said inlet port to pass into said storage chamber and thence to protrude from the free end of said hollow elongate probe means,
   (iii) actuating said stop means to prevent further movement of said filament through said hollow elongate probe means while continuing to feed filament into said chamber via said inlet to be stored therein in compact form,
   (iv) moving said tool to a position adjacent a first station,
   (v) attaching the free end protruding from said hollow elongate probe means to a predetermined attachment point,
   (vi) moving said tool along a predetermined path to a position adjacent a second station, and
   (vii) releasing the other free end of the filament adjacent a further attachment point.

10. A method according to claim 9, wherein said selected tool is provided with radially extending gap providing means operable to provide a gap extending along the whole length of the tool whereby said filament can be withdrawn from the tool bodily laterally, and further comprising the steps of attaching the other free end of the filament to a further attachment point, and operating said radially extending gap providing means to allow said filament to be withdrawn from the tool when its free ends are attached to their respective attachment points.

11. A method according to claim 9, which includes the step of attaching terminal means to at least one of said free ends.

12. A method according to claim 9, wherein the or each terminal means is provided with engagement means adapted to engage complementary engagement means provided on a respective connector element located at the or each station.

13. A method according to claim 9, which includes the step of causing the filament to adopt a coiled configuration within said storage chamber.

* * * * *